(12) United States Patent
Khazaai et al.

(10) Patent No.: US 12,189,001 B2
(45) Date of Patent: Jan. 7, 2025

(54) MAGNETIC LONG-RANGE POSITION SENSOR

(71) Applicant: Bourns, Inc., Riverside, CA (US)

(72) Inventors: Jay Jamshid Khazaai, Commerce, MI (US); Perry Wehlmann, Eastvale, CA (US); Gregory Scott DePue, Tustin, CA (US)

(73) Assignee: Bourns, Inc., Riverside, CA (US)

( * ) Notice: Subject to any disclaimer, the term of this patent is extended or adjusted under 35 U.S.C. 154(b) by 242 days.

(21) Appl. No.: 17/218,658

(22) Filed: Mar. 31, 2021

(65) Prior Publication Data

US 2021/0311138 A1 Oct. 7, 2021

Related U.S. Application Data

(60) Provisional application No. 63/005,914, filed on Apr. 6, 2020.

(51) Int. Cl.
| | | |
|---|---|---|
| *G01R 33/07* | (2006.01) | |
| *G01D 5/14* | (2006.01) | |
| *G01R 33/00* | (2006.01) | |
| *G01R 33/09* | (2006.01) | |

(52) U.S. Cl.
CPC ........... *G01R 33/072* (2013.01); *G01D 5/145* (2013.01); *G01R 33/007* (2013.01); *G01R 33/091* (2013.01)

(58) Field of Classification Search
CPC .............................. G01R 33/072; G01D 5/145
See application file for complete search history.

(56) References Cited

U.S. PATENT DOCUMENTS

| | | | |
|---|---|---|---|
| 4,841,246 A | 6/1989 | Juds et al. | |
| 5,444,370 A | 8/1995 | Wu | |
| 7,834,618 B2 | 11/2010 | Moura et al. | |
| 9,746,346 B2 | 8/2017 | Ausserlechner | |
| 9,810,518 B2 | 11/2017 | Kouno et al. | |
| 11,163,022 B2* | 11/2021 | Daubert | ............... G01R 33/077 |
| 2004/0027846 A1 | 2/2004 | Schroeder et al. | |

(Continued)

FOREIGN PATENT DOCUMENTS

| | | |
|---|---|---|
| CN | 1760630 A | 4/2006 |
| DE | 10145313 A1 | 9/2001 |

(Continued)

OTHER PUBLICATIONS

European Patent Office Extended Search Report for Application No. 21166560.9 dated Jul. 13, 2021 (7 pages).

(Continued)

*Primary Examiner* — Reena Aurora
(74) *Attorney, Agent, or Firm* — Michael Best & Friedrich LLP

(57) ABSTRACT

A magnetic position sensor comprises a first magnetic rod including a first end and a second end, and a second magnetic rod including a third end and a fourth end, the first end and the third end at a first distance, the second end and the fourth end at a second distance greater than the first distance. The magnetic position sensor further includes a magnet configured to travel relative to the first magnetic rod and the second magnetic rod along a first axis, and one or more magnetic sensors communicatively coupled to the magnet.

19 Claims, 13 Drawing Sheets
(2 of 13 Drawing Sheet(s) Filed in Color)

(56) References Cited

U.S. PATENT DOCUMENTS

| | | |
|---|---|---|
| 2004/0217757 A1 | 11/2004 | Tromblee |
| 2009/0278641 A1* | 11/2009 | Hedayat .............. F15B 15/2861 |
| | | 335/284 |
| 2011/0101964 A1 | 5/2011 | Ausserlechner et al. |
| 2018/0202835 A1 | 7/2018 | Moller et al. |
| 2020/0064156 A1 | 2/2020 | Hirano et al. |
| 2020/0088551 A1 | 3/2020 | Wissel et al. |

FOREIGN PATENT DOCUMENTS

| | | |
|---|---|---|
| DE | 10258254 A1 | 7/2003 |
| DE | 102007059402 A1 | 6/2009 |
| JP | 1989006701 A | 1/1989 |
| JP | H01-296101 A | 11/1989 |
| JP | 1996-035854 | 2/1996 |
| JP | H11-132709 A | 5/1999 |
| JP | 2001-041768 A | 2/2001 |
| JP | 2006-113039 A | 4/2006 |
| JP | 2006-214985 A | 8/2006 |
| JP | 2016-090353 A | 5/2016 |
| WO | 2003062741 A2 | 7/2003 |
| WO | 2014073055 A1 | 9/2016 |
| WO | 2017099866 A1 | 6/2017 |

OTHER PUBLICATIONS

European Patent Office Action for Application No. 21166560.9, dated Sept. 6, 2023 (4 pages).

Japanese Patent Office. Notice of Reasons for Rejection for Application No. 2021-062537, dated Oct. 2, 2024 (10 pages with translation).

* cited by examiner

| Linear Travel [mm] | Bmax [mT] | Bx[mT] | By[mT] | Bz[mT] |
|---|---|---|---|---|
| 0.00 | 76.76 | -76.76 | 0.42 | -0.27 |
| 2.50 | 72.68 | -72.67 | 1.14 | -0.02 |
| 5.00 | 74.07 | -74.08 | -0.69 | -0.24 |
| 10.00 | 66.44 | -66.43 | 0.01 | -0.02 |
| 20.00 | 51.98 | -51.99 | -0.45 | -0.14 |
| 30.00 | 46.45 | -46.44 | 1.11 | -0.26 |
| 50.00 | 31.65 | -31.65 | 0.54 | -0.14 |
| 100.00 | 13.91 | -13.91 | 0.25 | 0.01 |
| 200.00 | 3.10 | -3.09 | 0.09 | -0.02 |
| 300.00 | 0.65 | -0.65 | 0.00 | 0.01 |
| 400.00 | 0.29 | -0.29 | 0.00 | 0.00 |
| 500.00 | 0.11 | -0.11 | 0.00 | 0.00 |
| 550.00 | 0.07 | -0.07 | 0.00 | 0.00 |

| IC Tracks | MS0 muMetal, Iron, S1010 | | | | | |
|---|---|---|---|---|---|---|
| R [mm] | 190.50 |  | | | | |
| Arc Travel [mm] | Angel Travel [Deg.] | Bmax_S1010 [mT] | Bmax_Iron [mT] | Bmax_MuMetal | Bmax_MuMetal_S1010 [mT] | Bmax_MuMetal_Iron [mT] |
| 0.00 | 0.00 | 67.76 | 37.45 | 20.22 | 52.51 | 28.77 |
| 16.62 | 5.00 | 57.31 | 35.81 | 19.85 | 47.12 | 28.27 |
| 33.25 | 10.00 | 41.47 | 30.34 | 18.45 | 36.92 | 25.18 |
| 66.50 | 20.00 | 23.67 | 23.89 | 17.59 | 24.89 | 21.44 |
| 99.75 | 30.00 | 14.14 | 18.94 | 16.51 | 17.27 | 18.24 |
| 132.99 | 40.00 | 6.04 | 12.65 | 14.36 | 9.27 | 13.62 |
| 166.24 | 50.00 | 3.76 | 9.98 | 13.18 | 6.47 | 11.49 |
| 199.49 | 60.00 | 3.68 | 9.11 | 15.38 | 5.73 | 13.03 |
| 232.74 | 70.00 | 2.16 | 8.70 | 14.45 | 4.65 | 11.2 |
| 265.99 | 80.00 | 1.41 | 7.65 | 14.47 | 3.68 | 10.43 |
| 299.24 | 90.00 | 1.07 | 7.10 | 14.57 | 3.11 | 10.23 |
| 332.49 | 100.00 | 0.80 | 6.75 | 15.09 | 2.76 | 10.18 |
| 365.73 | 110.00 | 0.27 | 3.69 | 10.32 | 1.35 | 6.4 |
| 398.98 | 120.00 | 0.32 | 4.19 | 11.22 | 1.60 | 6.95 | ic position sensors. The magnetic sensors are configured to determine a position of the magnet
MAGNETIC LONG-RANGE POSITION SENSOR

RELATED APPLICATIONS

This application claims the benefit of U.S. Provisional Patent Application No. 63/005,914, filed Apr. 6, 2020, the entire content of which is hereby incorporated by reference.

BACKGROUND

Embodiments relate to magnetic position sensors.

SUMMARY

As their name suggests, magnetic position sensors are used to measure positions of objects or device components. For example, it is often useful to know the position of a vehicle seat, components in brake system, components in a clutch, a float in a fluid level system, and other objects or components. Position information may be used, among other things, to adjust the operation of a system or provide an indication of the status of the system (for example, fluid level "empty" or fluid level "full" based on information provided from a float and processed in a computer or similar device).

It is often useful to measure movement of a target in a linear or rotary/angular position system. Among other things, embodiments provided herein help resolve problems associated with costs and technical complexities of linear and angular magnetic position sensors for measuring relatively long travelling ranges of a target. In addition, embodiments provide, among other things, flexibility in sensor packaging design for small to large footprints. Embodiments also provide, among other things, improved accuracy, improved linearity, and reduced mechanical and magnetic errors (hysteresis).

One embodiment provides a magnetic position sensor comprising a first magnetic rod including a first end and a second end, and a second magnetic rod including a third end and a fourth end. The first end and the third end are a first distance from each other. The second end and the fourth end are a second distance from each other and the second distance is greater than the first distance. The magnetic position sensor also includes a magnet configured to travel relative to the first magnetic rod and the second magnetic rod along a center axis. One or more magnetic sensors are communicatively coupled to the magnet.

In some embodiments, the magnetic position sensor includes a gap between the first magnetic rod and the second magnetic rod. The gap has a first width (equal to the first distance) between the first end and the third end. The gap widens to a second width (equal to the second distance) between the second end and the fourth end. In some examples, the gap increases linearly from the first distance to the second distance. In some embodiments, the center axis intercepts the center of the gap between the first end and the third end. The center axis also intercepts the center of the gap between the second end and the fourth end.

In some embodiments, the first magnetic rod and the second magnetic rod are fixed, and the magnet moves along the center axis. In some embodiments, the magnet is fixed, and the first magnetic rod and the second magnetic rod move between the magnet and the one or more magnetic sensors along the center axis. In some embodiments, the one or more magnetic sensors includes a first magnetic sensor fixed between the first end and the third end, and a second magnetic sensor located opposite the magnet.

In some embodiments, the first magnetic rod and the second magnetic rod are linear. In some embodiments, the first magnetic rod and the second magnetic rod are curved. In some embodiments, the first magnetic rod and the second magnetic rod are separated by a fixed angle of θ degrees (for example, approximately 1 degree). In some embodiments, the one or more magnetic sensors sense a magnetic flux to determine a location of the magnet.

Another embodiment provides a position detection system comprising a magnetic position sensor including a track, a magnet, and one or more magnetic sensors. The magnetic sensors are configured to determine a position of the magnet along the track based on a magnetic flux. The system also includes one or more temperature sensors connected to the magnetic position sensor and the first and second magnetic rods, and an electronic processor connected to the magnetic position sensor and the temperature sensor. The electronic processor is configured to receive one or more position signals from the magnetic position sensor, receive one or more temperature signals from the temperature sensor, and determine a position of the magnet based on the one or more position signals and the one or more temperature signals.

In some embodiments, the track is composed of a first conductive rod and a second conductive rod. In some embodiments, the first conductive rod extends substantially along a first axis, and the second conductive rod extends substantially along a second axis different from the first axis. In some embodiments, the second axis is offset from the first axis by a fixed angle of θ degrees (for example, approximately 1 degree). In some embodiments, the first conductive rod and the second conductive rod each have a length of approximately $L_{FR}$ or $L_{SR}$ (for example, approximately 550 mm long). In some embodiments, the first conductive rod and the second conductive rod may have a relative magnetic permeability ranging from low to high values.

In some embodiments, the one or more magnetic sensors include a first magnetic sensor situated below the track, and a second magnetic sensor connected to the track. In some embodiments, the position signal from the magnetic position sensor is based on a magnetic flux. In some embodiments, the track is substantially linear. In some embodiments, the track is substantially arc-shaped. In some embodiments, the track is composed of at least one selected from a group consisting of carbon steel 1010, pure iron, and Mu-metal, wherein the group is a metallic group of materials having low to high relative permeability.

Other aspects and embodiments will become apparent by consideration of the detailed description and accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figures 1A, 1B:
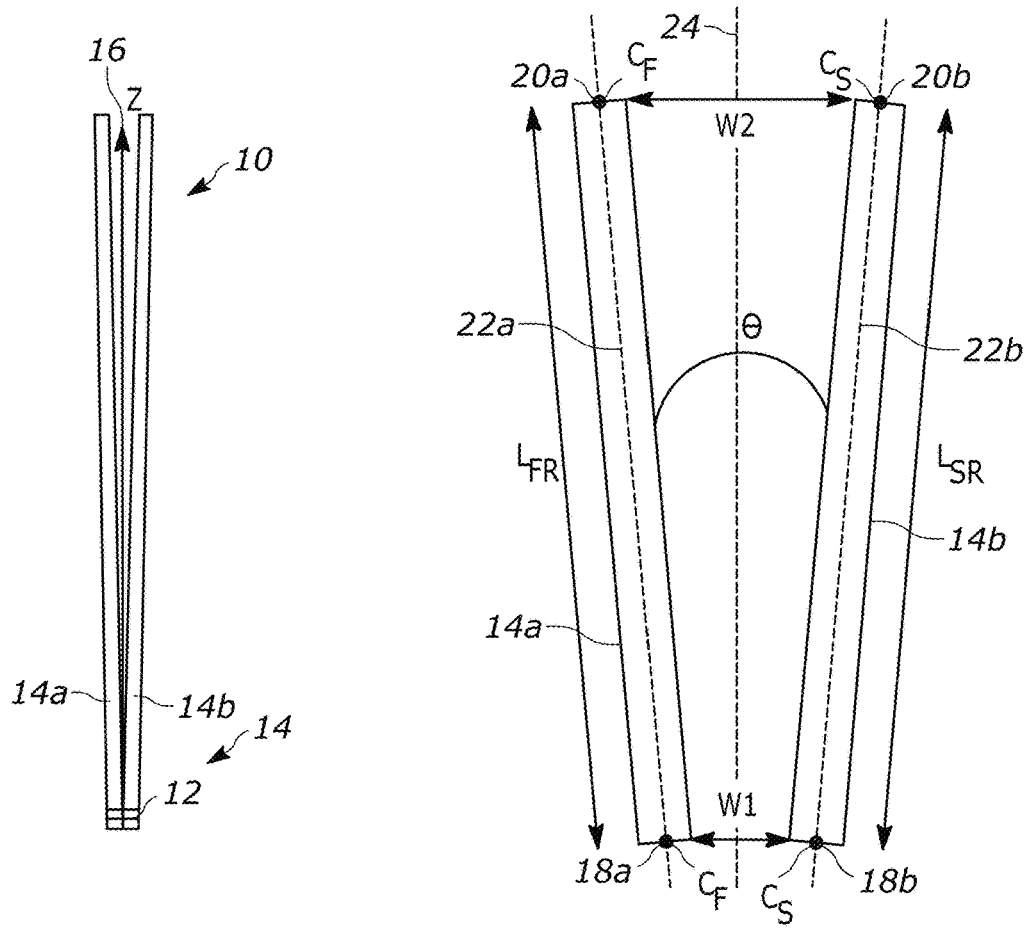
FIGS. 1A-1D are perspective views of a linear magnetic position sensor, according to some embodiments.
Figure 1C:
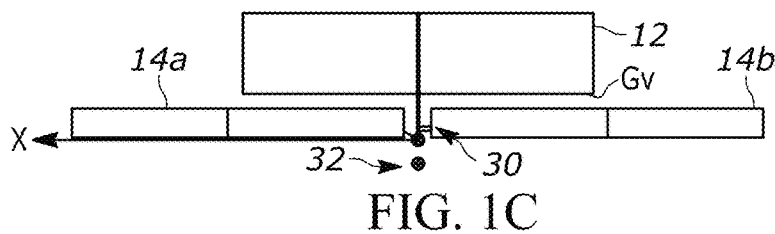
Figure 1D:
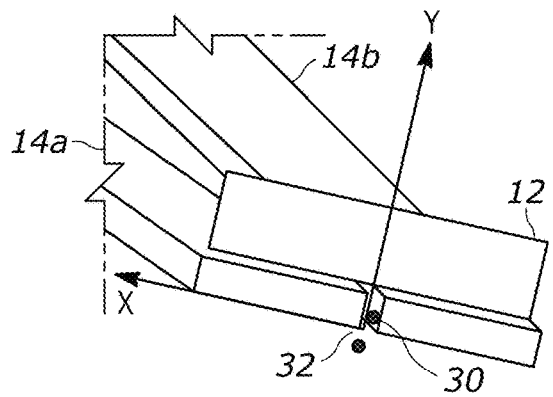

Before any embodiments are explained in detail, it is to be understood that the embodiments are not limited in their application to the details of construction and the arrangement of components set forth in the following description or illustrated in the following drawings. Other embodiments are possible, and embodiments described and/or illustrated are capable of being practiced or of being carried out in various ways.

FIGS. 1A-1D illustrate one embodiment of a magnetic position sensor 10 that includes a magnet 12 situated above a first magnetic rod 14a and a second magnetic rod 14b separated by a gap 16. The first magnetic rod 14a and the second magnetic rod 14b may form a singular track 14. In this example, the first magnetic rod 14a and the second magnetic rod 14b are substantially linear. In some embodiments, the first magnetic rod 14a and the second magnetic rod 14b each have a length of 550 mm, a width of 11 mm, and a height of 2 mm. In some embodiments, the first magnetic rod 14a and the second magnetic rod 14b are composed of at least one material selected from a group consisting of a conductive material, a magneto-resistive material, a ferromagnetic material, and ferrous material.

As seen in FIG. 1B, the first magnetic rod 14a includes a first end 18a and a second end 20a separated by a length $L_{FR}$ of the first magnetic rod 14a. A first axis 22a intercepts a center CF of the first end 18a and the second end 20a. The second magnetic rod 14b includes a third end 18b and a fourth end 20b separated by a length $L_{SR}$ of the second magnetic rod 14b. A second axis 22b intercepts a center Cs of the third end 18b and the fourth end 20b. The gap 16 is defined by a first distance or width W1 between the first end 18a and the third end 18b, and a second distance or width W2 between the second end 20a and the fourth end 20b. In some embodiments, the first distance W1 may be approximately 1.5 mm. In some embodiments, the second distance W2 may be approximately 20.6 mm. Due to the gap 16, the first magnetic rod 14a and the second magnetic rod 14b may form a substantially "V" shape, as the width of the gap 16 increases linearly from the first distance W1 to the second distance W2. In some embodiments, the first magnetic rod 14a and the second magnetic rod 14b are separated by an angle, represented by θ in FIG. 1B. In some embodiments, the angle θ is approximately 1 degree.

In some embodiments, the magnet 12 is situated above the first magnetic rod 14a and the second magnetic rod 14b so that the magnet 12 moves along the track 14. In some embodiments, the magnet 12 has a length of 21.5 mm, a width of 11.0 mm, and a height of 2.0 mm. The magnet 12 may be separated from the track 14 by a vertical gap $G_v$. The vertical gap $G_v$ may be, for example, approximately 0.5 mm to 1.0 mm. When moving, the magnet 12 may move along the center of the track 14, shown by the center axis 24. The center axis 24 intercepts the center of the first distance created by the first end 18a and the third end 18b, and intercepts the center of the second distance created by the second end 20a and the fourth end 20b. As the magnet 12 moves along the track 14, the magnetic flux created by the magnet 12 may be impacted by the first magnetic rod 14a and the second magnetic rod 14b. In some embodiments, the magnet 12 moves relative to the track 14, and the track 14 remains stationary. In other embodiments, the magnet 12 is stationary and the track 14 moves relatively to the magnet 12.

In some embodiments, the magnetic position sensor 10 includes a first magnetic sensor 30 and a second magnetic sensor 32 is communicatively coupled to the magnet 12. The first magnetic sensor 30 and the second magnetic sensor 32 may be, for example, Hall sensors configured to detect magnetic flux. The first magnetic sensor 30 may be, for example, situated between the first end 18a and the third end 18b. In some embodiments, the first magnetic sensor 30 is connected to a body or device floor (not shown) of the magnetic position sensor 10 or a device in which the magnetic position sensor 10 is situated. In some embodiments, the second magnetic sensor 32 may be, for example, situated below the track 14 and on the center axis 24. In some embodiments, the second magnetic sensor 32 may be coupled to the magnet 12 such that the second magnetic sensor 32 travels below and substantially even with the magnet 12.

In some embodiments, the first magnetic sensor 30 and the track 14 are stationary as the magnet 12 moves along the track 14. For example, the first magnetic sensor 30 may be coupled to the track 14. In some embodiments, the second magnetic sensor 32 and the magnet 12 are stationary as the track 14, with the coupled first magnetic sensor 30, moves between the second magnetic sensor 32 and the magnet 12. In some embodiments, only the first magnetic sensor 30 is utilized by or present within the magnetic position sensor 10. In other embodiments, only the second magnetic sensor 32 is utilized by or present within the magnetic position sensor 10. In some embodiments, both the first magnetic sensor 30 and the second magnetic sensor 32 are utilized by or present within the magnetic position sensor 10. For example, the first magnetic sensor 30 may be stationary as the second magnetic sensor 32 and the magnet 12 move along the track 14.

Figure 2:
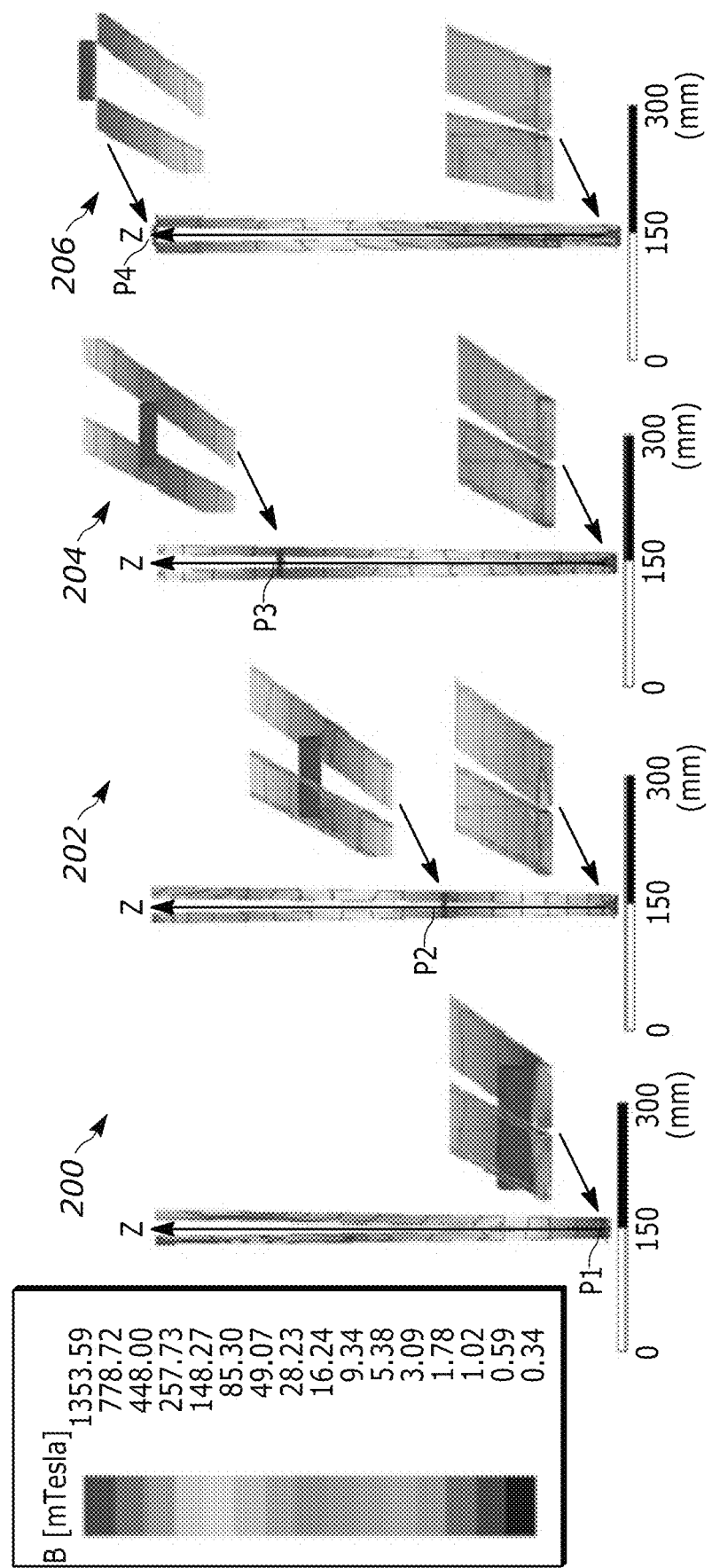
FIG. 2 is a top view of the linear magnetic position sensor of FIGS. 1A-D illustrating the magnetic flux experienced by the track, according to some embodiments.

FIG. 2 illustrates the magnetic flux experienced by the track 14 as the magnet 12 moves relative to the track 14. For example, in image 200, the magnet 12 is situated at approximately the first end 18a and the third end 18b at position P1. The magnetic field is strongest at the first end 18a and the third end 18b. Accordingly, in position P1, the first magnetic sensor 30 and the second magnetic sensor 32 experience the greatest magnetic flux (for example, a large level of magnetic flux or a maximum level of magnetic flux) relative to positions P2, P3, and P4.

In image 202, the magnet 12 is situated approximately ⅓ of the way along or across the track 14 at position P2. In position P2, the magnetic field has decreased at the first end 18a and the third end 18b. Accordingly, the first magnetic sensor 30 experiences less magnetic flux (for example, a medium level of magnetic flux). In some embodiments, the second magnetic sensor 32 travels with the magnet 12. Although the second magnetic sensor 32 continues to experience a high amount of magnetic flux, the increase in the size of the gap 16 impacts the direction of the magnetic field. Accordingly, the second magnetic sensor 32 experiences a greater change in magnetic flux relative to position P1.

In image 204, the magnet 12 is situated approximately ⅔ of the way along or across the track 14 at position P3. In position P3, the magnetic field has further decreased at the first end 18a and the third end 18b. Accordingly, the first magnetic sensor 30 experiences even less magnetic flux (for example, a low level of magnetic flux). In some embodiments, the second magnetic sensor 32, which continues to travel with the magnet 12, experiences a greater change in magnetic flux (relative to position P2) due to the increased size of the gap 16.

In the image 206, the magnet 12 is situated fully along across the track 14 at the second end 20a and the fourth end 20b at position P4. In position P4, the first magnetic sensor 30 experiences a lowest level of magnetic flux, relative to positions P1, P2, P3, and P4. In some embodiments, the second magnetic sensor 32, also now situated at the second end 20a and the fourth end 20b, experiences a greatest change in magnetic flux (relative to positions P1, P2 and P3) due to the increased size of the gap 16.

Figure 3A:
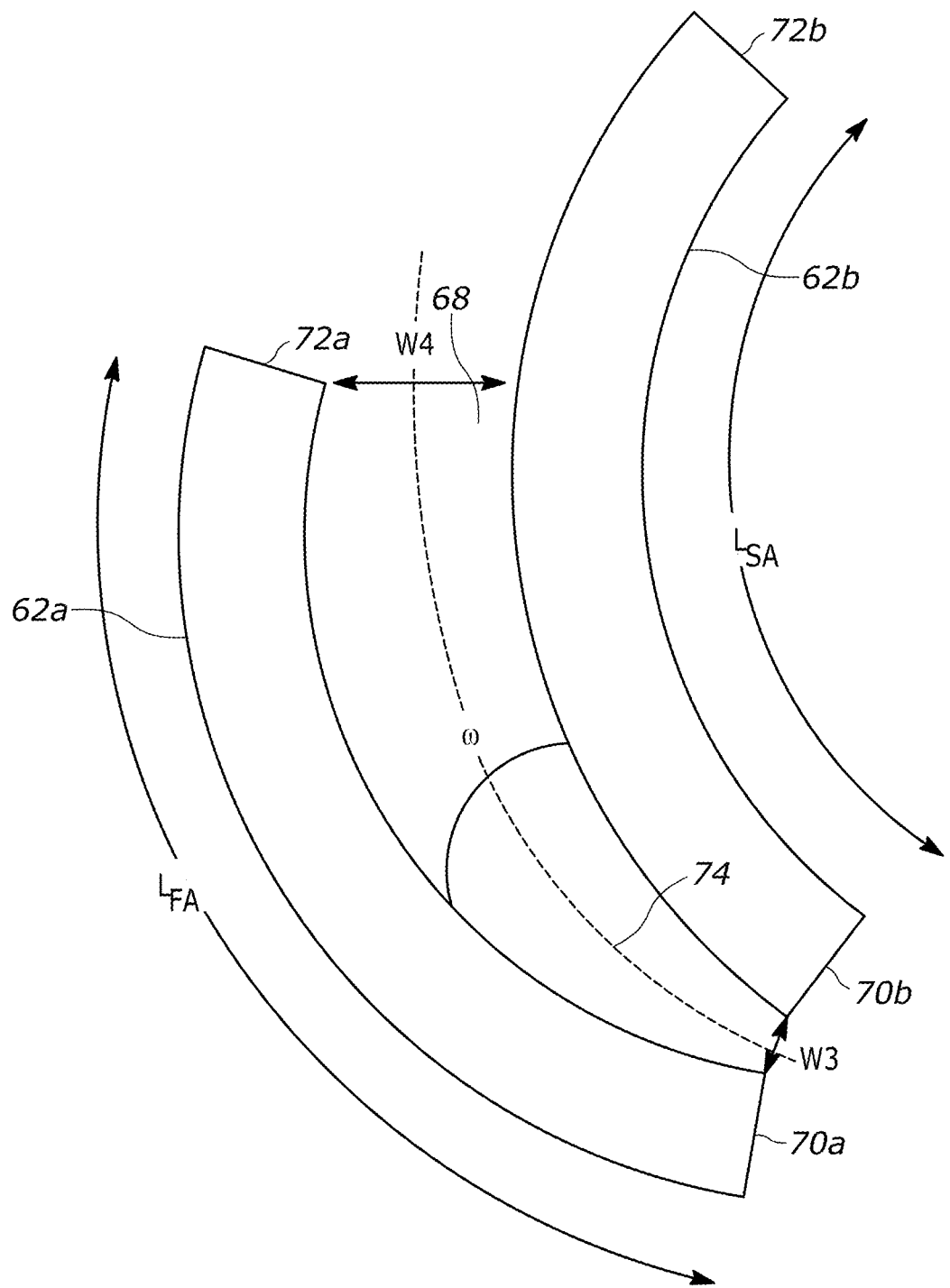
FIGS. 3A-3D are top views of an angular magnetic position sensor illustrating a magnet in various positions, according to some embodiments.

FIGS. 3A-3D illustrate another embodiment of a magnetic position sensor 10, where the magnetic position sensor 10 includes a first curved magnetic rod 62a and a second curved magnetic rod 62b forming a curved track 62. The curved track 62 may be an arc, an oval, a crescent, a circle, or another curved shape. In some embodiments, as illustrated in FIG. 3A, the first curved magnetic rod 62a includes a first end 70a and a second end 72a similar to that of the first magnetic rod 14a. The first end 70a and the second end 72a are separated by a distance $L_{F4}$, defined by the length of the first curved magnetic rod 62a. In some embodiments, the second curved magnetic rod 62b includes a third end 70b and a fourth end 72b similar to that of the second magnetic rod 14b. The third end 70b and the fourth end 72b are separated by a distance $L_{S4}$, defined by the length of the second curved magnetic rod 62b.

A curved gap 68 is situated between the first curved magnetic rod 62a and the second curved magnetic rod 62b. Similar to the gap 16, the curved gap 68 increases from a third distance or width W3 between the first end 70a of the first curved magnetic rod 62a and the third end 70b of the second curved magnetic rod 62b to a fourth distance or width W4 between the second end 72a of the first curved magnetic rod 62a and the fourth end 72b of the second curved magnetic rod 62b. In some embodiments, the first curved magnetic rod 62a and the second curved magnetic rod 62b are separated by an angle, shown as ω in FIG. 3A.

Figure 3B:
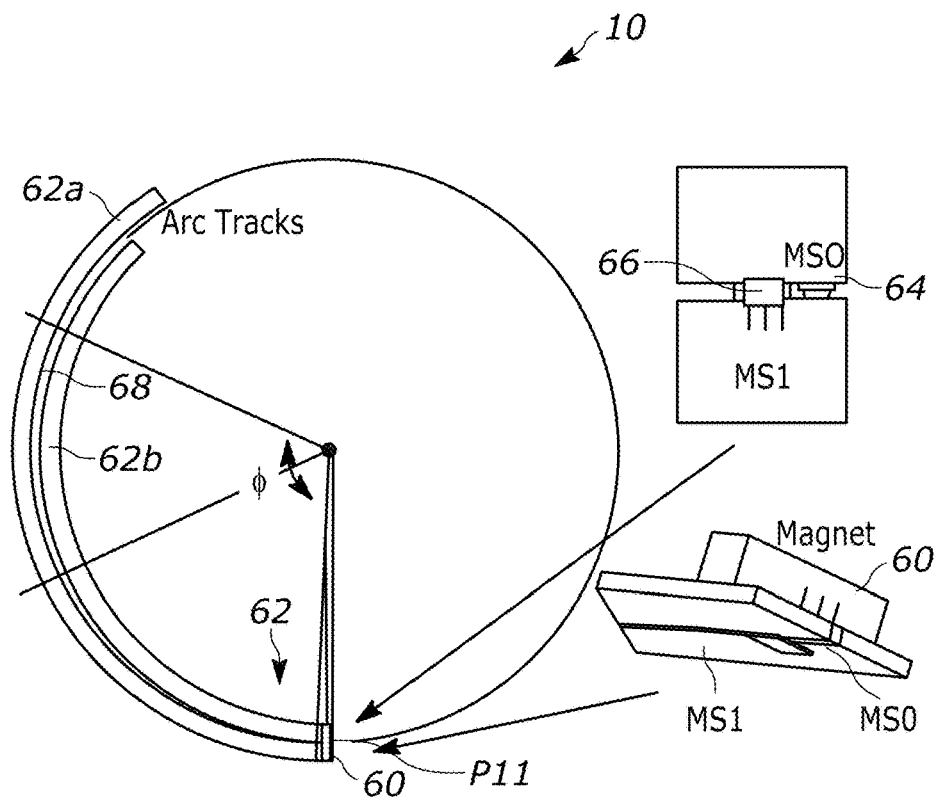
Figure 3C:
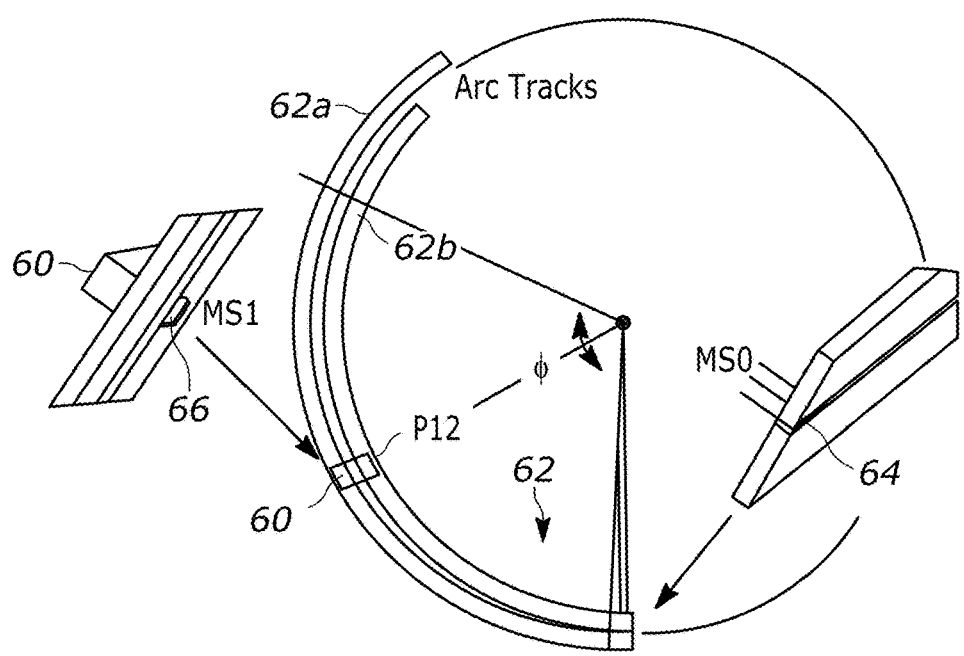
Figure 3D:
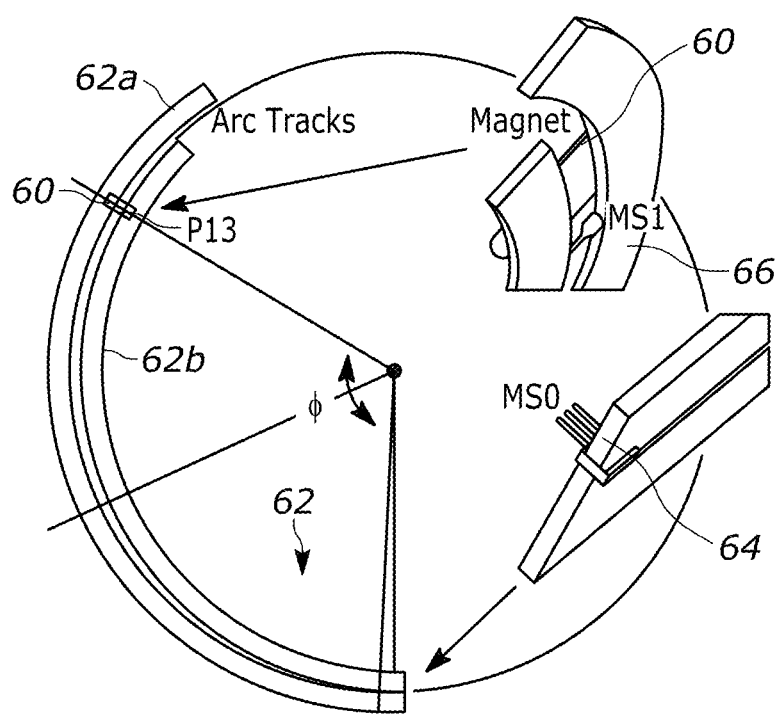

Additionally, as shown in FIGS. 3B-3D, the magnetic position sensor 10 includes a magnet 60 substantially similar to that of magnet 12. A third magnetic sensor 64 and fourth magnetic sensor 66 function similar to that of the first magnetic sensor 30 and the second magnetic sensor 32, respectfully. The magnet 60 may be configured to travel along the center axis 74, similar to that of center axis 24.

In some embodiments, the third magnetic sensor 64 and the curved track 62 are substantially stationary as the magnet 60 moves across the curved track 62. For example, the third magnetic sensor 64 may be coupled to the curved track 62. In some embodiments, the magnet 60, and the coupled fourth magnetic sensor 66, are substantially stationary as the curved track 62 moves between the magnet 60 and the fourth magnetic sensor 66. In some embodiments, only the third magnetic sensor 64 is utilized by or present within the magnetic position sensor 10. In other embodiments, only the fourth magnetic sensor 66 is utilized by or present within the magnetic position sensor 10. In some embodiments, both the third magnetic position sensor 64 and the fourth magnetic position sensor 66 are utilized by or present within the magnetic position sensor 10. For example, the third magnetic position sensor 64 may be station as the fourth magnetic position sensor 66 and the magnet 60 move along the track 62.

Figure 4:
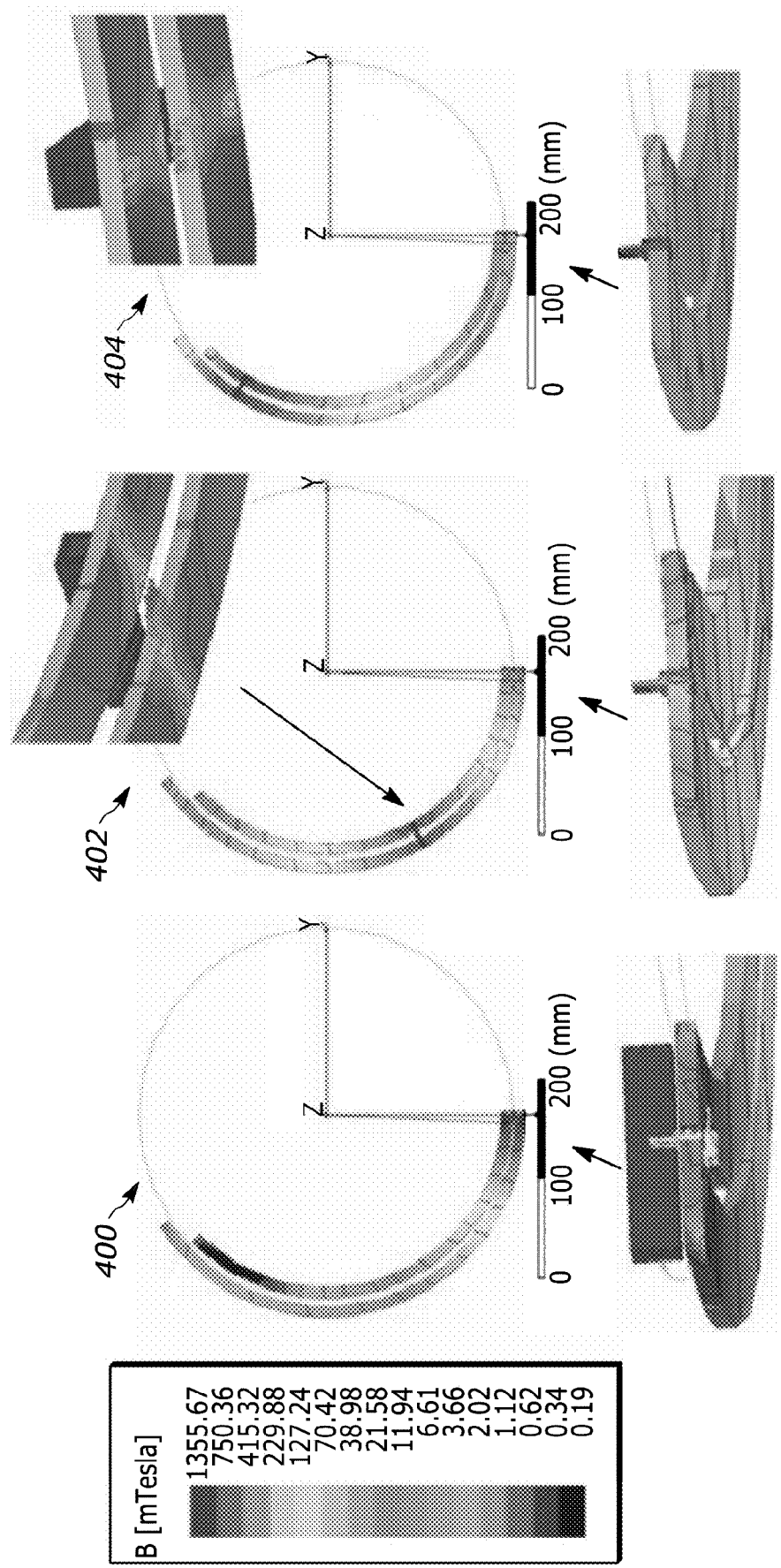
FIG. 4 is a perspective view of the angular magnetic position sensor of FIGS. 3A-D illustrating the magnetic flux experienced by the track, according to some embodiments.

FIG. 4 illustrates the magnetic flux experienced by the curved track 62 as the magnet 60 moves relative to the curved track 62. For example, in image 400, the magnet 60 is situated at approximately a position P11, or at the first end 70a and the third end 70b of the first curved magnetic rod 62a and the second curved magnetic rod 62b (e.g., the beginning of the curved track 62), respectfully. At position P11, the magnetic field is strongest at the beginning of the curved track 62. Accordingly, in this position, the third magnetic sensor 64 and the fourth magnetic sensor 66 experience the greatest magnetic flux relative to positions P12 and P13.

In image 402, the magnet 60 is situated at a position P12, or approximately ½ of the way across the curved track 62. In position P12, the magnetic field has decreased at the beginning of the curved track 62. Accordingly, the third magnetic sensor 64 experiences less magnetic flux (for example, a medium level of magnetic flux). In some embodiments, the fourth magnetic sensor 66 travels with the magnet 60. Although the fourth magnetic sensor 66 continues to experience a high amount of magnetic flux, the increase in the size of the curved gap 68 impacts the direction of the magnetic field. Accordingly, the fourth magnetic sensor 66 experiences a greater change in magnetic flux relative to position P11.

In image 404, the magnet 60 is at a position P13, situated fully across or along the curved track 62 at approximately the second end 72a of the first curved magnetic rod 62a and the fourth end 72b of the second curved magnetic rod 62b (e.g., the end of the curved track 62). Accordingly, the third magnetic sensor 64 experiences even less magnetic flux (for example, a low level of magnetic flux) relative to position P12. In some embodiments, the fourth magnetic sensor 66, also now situated at the end of the curved track 62, experiences a greatest change in magnetic flux relate to positions P11, P12 and P13 due to the increased size of the curved gap 68.

Figure 5A:
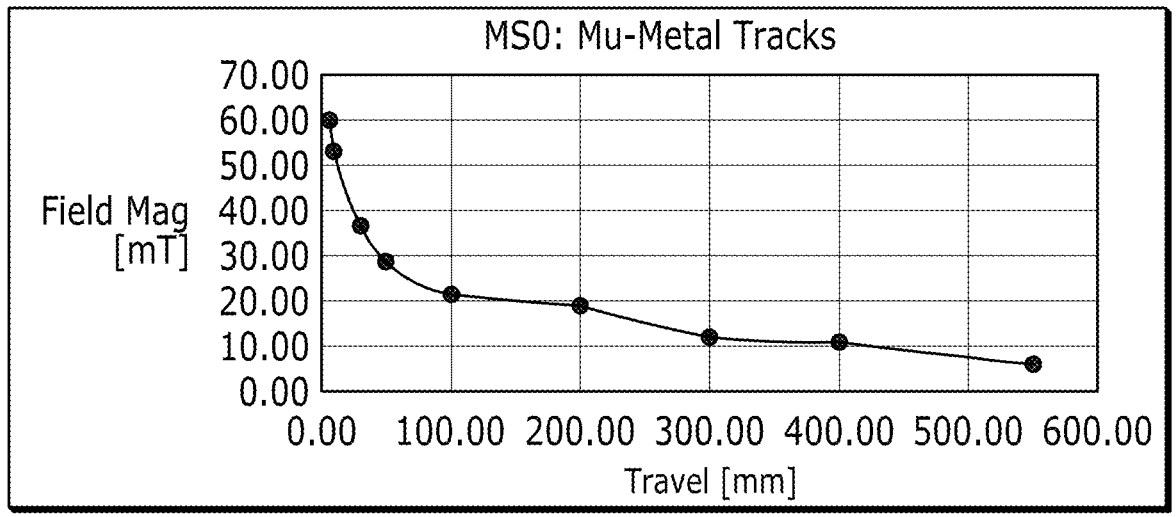
FIGS. 5A-5C are graphs comparing the magnetic flux experienced by a magnetic sensor of FIG. 1 and FIG. 3, according to some embodiments.
Figure 5B:
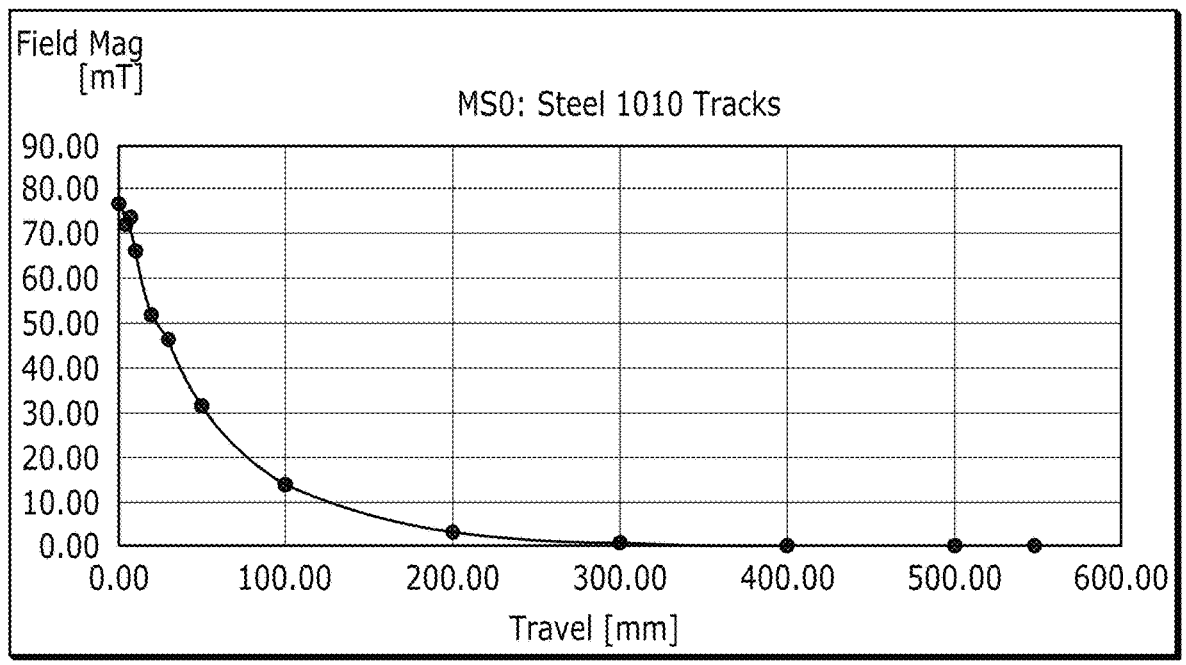
Figure 5C:
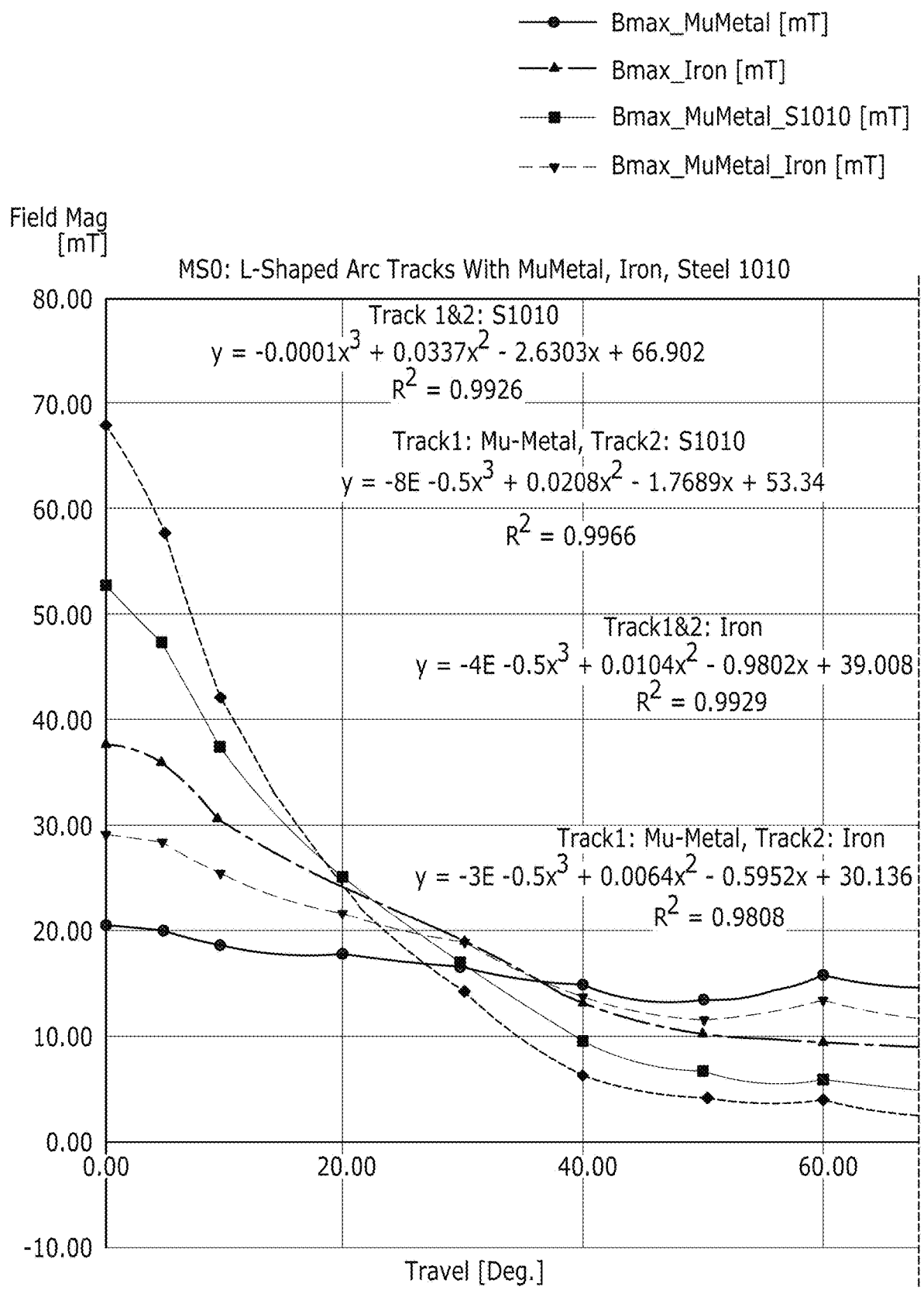
Figure 5C:
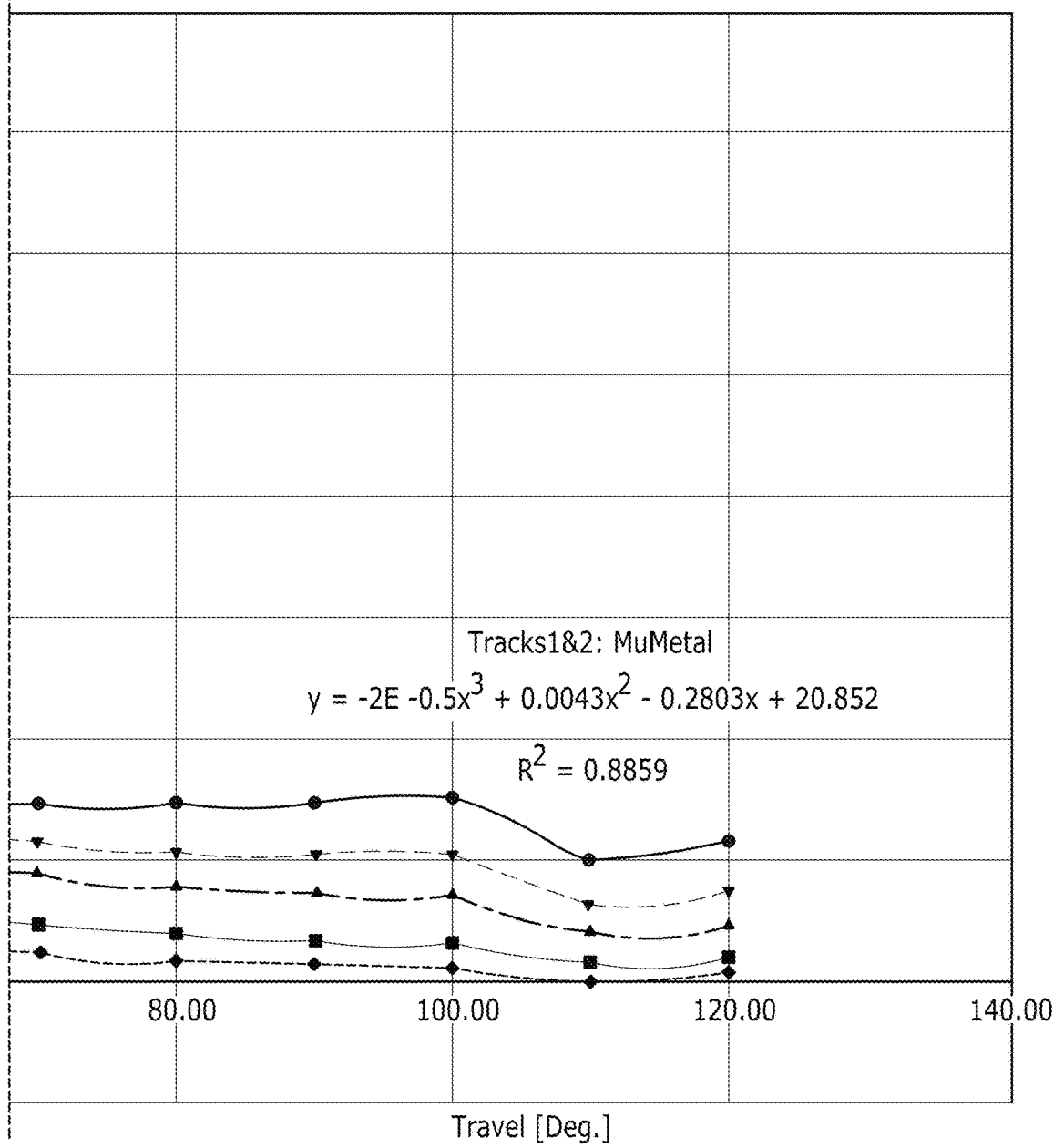
Figure 5C:

In some embodiments, the material of the tracks 14 and 62 impacts the magnetic field of the magnets 12 and 60 and, therefore, impacts the magnetic flux experienced by the magnetic sensors 30, 32, 64, and 66. For example, Mu-metal has a high permeability in comparison to AISI steel 1010, more generally referred to as carbon steel. The different permeability allows for different re-direction of the magnetic flux density of the magnet 12, 60. High permeability, for example, attracts more flux density, resulting in more magnetic flux being concentrated in the path formed by the track 14, 62. A lower permeability, for comparison, attracts less magnetic field and instead acts similarly to a magnet itself. FIGS. 5A-B illustrate graphs showing the magnetic flux experienced by the first magnetic sensor 30. In FIG. 5A, the track 14 is composed of Mu-metal. In FIG. 5B, the track 14 is composed of AISI steel 1010. FIG. 5C illustrates a graph showing the magnetic flux experienced by the third magnetic sensor 64 when the track 62 is composed of at least one selected from a group consisting AISI steel 1010, pure iron, and Mu-metal. Accordingly, the material of the track 14, 62 may be accounted for when implementing the magnetic position sensor 10.

It should be understood that the angle θ can be chosen or selected for the particular application of the sensor. In some embodiments, the angle θ between the first magnetic rod 14a and the second magnetic rod 14b impacts the magnetic field of the magnet 12. Therefore, the angle θ impacts the magnetic flux experienced by the magnetic sensors 30, 32. Similarly, in some embodiments, the angle ω between the first curved magnetic rod 62a and the second curved magnetic rod 62b impacts the magnetic field of the magnet 60. Therefore, the angle ω impacts the magnetic flux experienced by the magnetic sensors 64, 66. If the chosen angle θ or ω is too small (for example, 0.5 degrees), the respective magnetic rods in the tracks 14, 62 may experience a magnetic field exchange, reducing the amount of flux density experienced by the respective magnetic sensors 30, 32, 64, 66. Accordingly, the angle θ or ω may be chosen such that the magnets 12, 60 generate the desired magnetic flux density.

Figure 6:
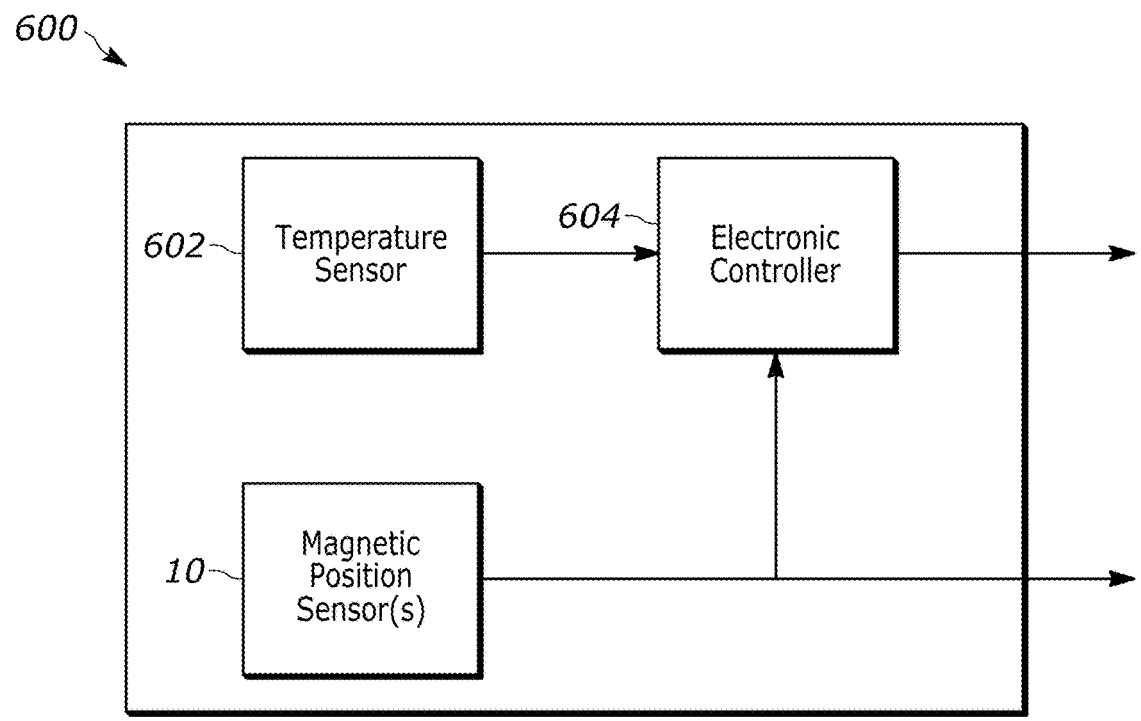
FIG. 6 is a system incorporating the magnetic position sensor, according to some embodiments.

FIG. 6 illustrates a block diagram of a system 600 incorporating the magnetic position sensor 10, according to some embodiments. In the example shown, the system 600 includes a temperature sensor 602 and an electronic controller 604 configured to receive signals from the magnetic position sensor 10 and the temperature sensor 602. The magnetic position sensor 10 is configured to send one or more magnetic position signals indicative of the position (e.g., the location) of the magnet 12, 60 to the electronic controller 604. The temperature sensor 602 is configured to send one or more temperature signals to the electronic controller 504 based on at least one selected from a group consisting of an ambient temperature and a temperature of the track 14,62. In some embodiments, the electronic controller 604 may output an output signal based on the one or more temperature signals and one or more magnetic position signals received from the magnetic position sensor 10 to an external device. In some embodiments, the electronic controller 604 may output system software and hardware diagnostic fault codes to an external device. The diagnostic fault codes may be transmitted separately-from or along with magnetic position signals from the magnetic position sensor 10 and temperature signals from the temperature sensor 602. In some embodiments, the magnetic position sensor 10 transmits one or more magnetic position signals, with or without embedded diagnostic fault code, to the external device directly.

Figure 7:
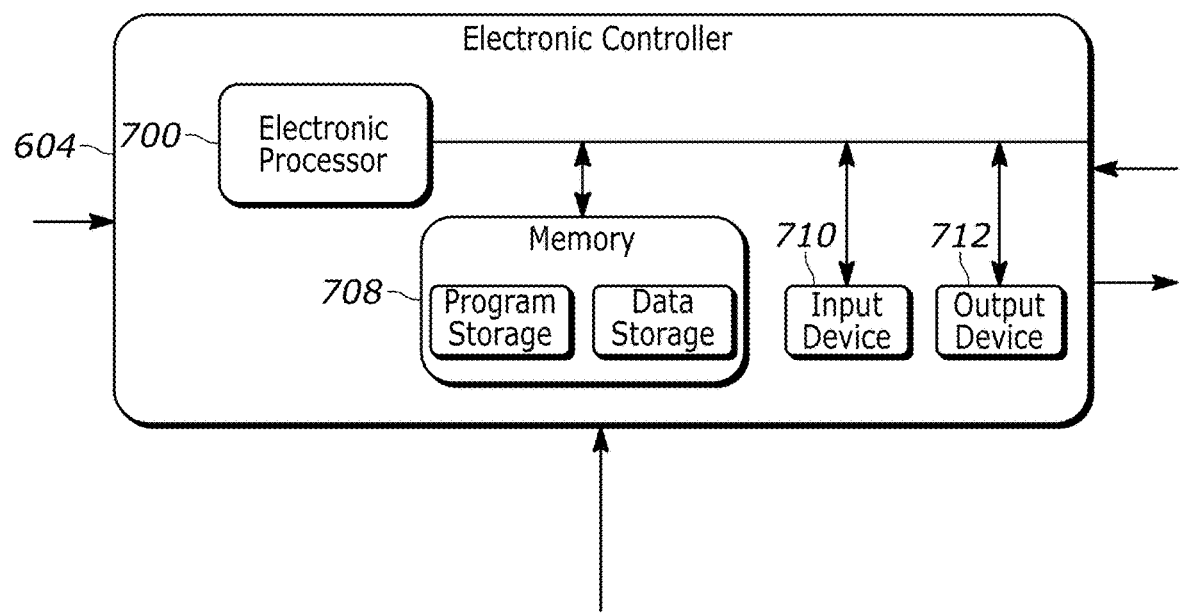
FIG. 7 is a block diagram of a controller, according to some embodiments.

FIG. 7 illustrates a block diagram of an electronic controller 604 (e.g., a computer, a microcontroller, a microprocessor, an electronic processor, or similar device or group of devices). In the embodiment illustrated, the electronic controller 604 includes an electronic processor 700, a memory 708, input devices 710, and output devices 712. The electronic processor 700, the memory 708, the input devices 710, and the output devices 712, as well as various modules or circuits connected to the electronic controller 604, are connected by one or more control and/or data buses. The memory 708 includes a program storage area and a data storage area. The program storage area and the data storage area can include combinations of different types of memory 708, such as machine-readable non-transitory memory, read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The electronic processor 700 is connected to the memory 708 and executes software instructions that are capable of being stored in a RAM of the memory 708 (e.g., during execution), a ROM of the memory 708 (e.g., on a generally permanent basis), or another non-transitory computer readable medium. Software included for the processes and methods for the system 600 can be stored in the memory 708 of the electronic controller 604. The software can include firmware, one or more applications, program data, filters, rules, one or more program modules, and other executable instructions. The electronic controller 604 is configured to retrieve from memory 708 and execute, among other things, instructions related to the control processes and methods described herein. In other constructions, the electronic controller 604 includes additional, fewer, or different components.

Electrical and (electro)-magnetic characteristics (e.g., permeability) of components of the magnetic position sensor 10, for example, the tracks 14 and 62 may be dependent on the temperature. Accordingly, the magnetic flux experienced by the magnetic sensors 30, 32, 64, and 66 may also be dependent on the temperature. In some embodiments, the electronic controller 604 is configured to determine the position of the magnet 12, 60 based on one or more magnetic position signals and on the one or more temperature signals.

Figure 8:
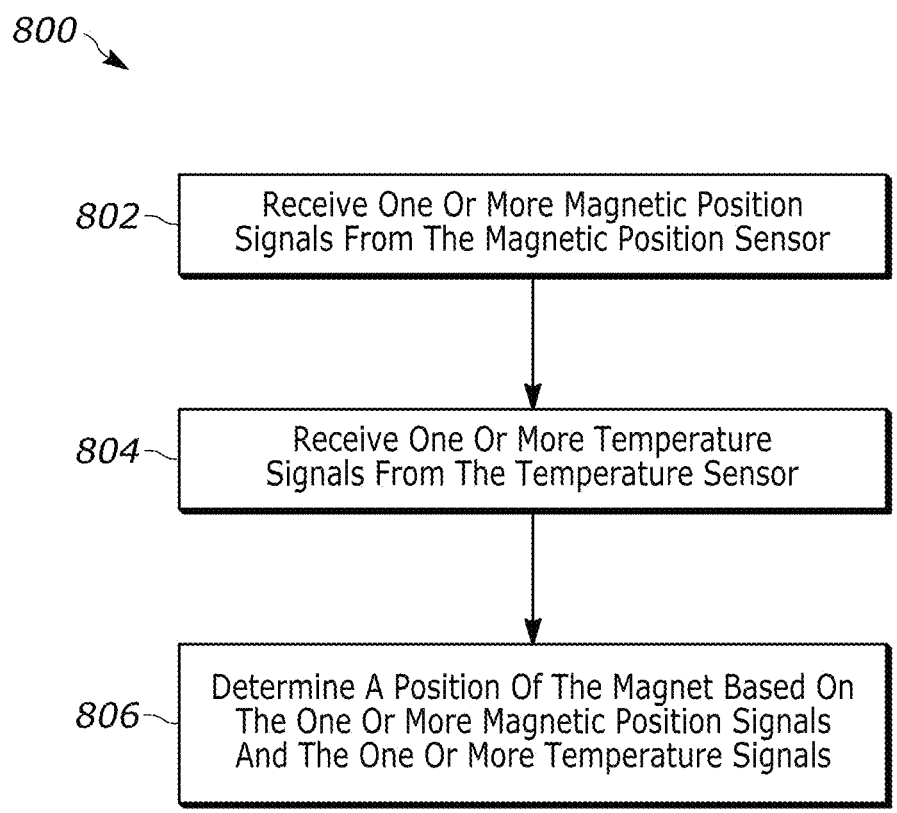
FIG. 8 is a method performed by the controller of FIG. 7, according to some embodiments.

FIG. 8, for example, illustrates a block diagram of a method 800 performed by the electronic controller 604 for determining the position of the magnet. At block 802, the electronic controller 604 receives one or more magnetic position signals from the magnetic position sensor 10. The one or more magnetic position signals may be, for example, the magnetic flux experienced by the first magnetic sensor 30, the second magnetic sensor 32, or a combination of the first magnetic sensor 30 and the second magnetic sensor 32. In some embodiments, the one or more magnetic position signals may represent the magnetic flux experienced by the third magnetic sensor 64, the fourth magnetic sensor 66, or a combination of the third magnetic sensor 64 and the fourth magnetic sensor 66.

At block 804, the electronic controller 604 receives one or more temperature signals from the temperature sensor 602. The temperature signals may represent the ambient temperature, the temperature of a component of the magnetic position sensor 10 (such as the track 14, 62), or a combination of the ambient temperature and the temperature of a component of the magnetic position sensor 10. At block 806, the electronic controller 604 determines a position of the magnet 12, 60 based on the one or more magnetic position signals and the one or more temperature signals. In some embodiments, the electronic controller 604 transmits the position of the magnet 12, 60 to an external device. Prior to transmission, the position of the magnet 12, 60 may be conditioned using a filter (for example, a low-pass filter, a high-pass filter, or the like), may be converted to a digital format, or the like. In some embodiments, a linearization of the output signal may be performed by the magnetic sensor 10, the electronic controller 604, or some combination thereof prior to transmission to the external device.

Water Level Sensor Example

Water level detection is one of many applications for the magnetic position sensor 10. In one example, a water tank includes four potential levels of water (e.g., level 1, level 2, level 3, and level 4). In some embodiments, level 1 is a low level (¼) of water, level 2 if a medium level of water (½), level 3 is a high level of water (¾), and level 4 is a full tank (1). The water tank may include, for example, a reservoir configured to hold water and one or more openings configured to allow water to enter and exit the reservoir. The magnetic position sensor 10 may be, for example, attached to a side of the reservoir, such that the first end 18a and the third end 18b are situated at the bottom of the reservoir, and such that the second end 20a and the fourth end 20b are situated at the top of the reservoir. Additionally, the magnet 12 is connected to or otherwise incorporated in a buoyant float such that the physical position of the magnet 12 corresponds to the physical level of a top surface of the water contained within the reservoir.

Referring to FIG. 2, when the reservoir is at a water level of level 1, the magnetic flux experienced by the magnetic position sensor 10 may be, for example, the magnetic flux shown by image 200. When the reservoir is at a water level of level 2, the magnetic flux experienced by the magnetic position sensor 10 may be, for example, the magnetic flux shown by image 202. When the reservoir is at a water level of level 3, the magnetic flux experienced by the magnetic position sensor 10 may be, for example, the magnetic flux shown by image 204. When the reservoir is at a water level of level 4, the magnetic flux experienced by the magnetic position sensor 10 may be, for example, the magnetic flux shown by image 206.

The electronic controller 604 receives one or more magnetic position signals from the magnetic position sensor 10. In some embodiments, the electronic controller 604 also receives one or more temperature signals indicative of the temperature of the water from the temperature sensor 602. Based on the one or more magnetic position signals and the one or more temperature signals, the electronic controller 604 determines the level of the water stored within the reservoir of the water tank.

Thus, embodiments provide, among other things, a magnetic position sensor. Various features and advantages are set forth in the following claims.

What is claimed is:

1. A magnetic position sensor comprising:
    a first magnetic rod including a first end and a second end;
    a second magnetic rod including a third end and a fourth end, wherein the first magnetic rod and the second magnetic rod form a track with a center axis located between the first magnetic rod and the second magnetic rod, the first end and the third end are separated by a first distance, and the second end and the fourth end are separated by a second distance which is greater than the first distance;
    a magnet spaced from the track by a vertical gap and configured to travel along the center axis; and
    one or more magnetic sensors communicatively coupled to the magnet, wherein the one or more magnetic sensors include a first magnetic sensor fixed between the first end and the third end, and a second magnetic sensor situated below the track and configured to travel with the magnet.

2. The magnetic position sensor of claim 1, further comprising:
    a gap between the first magnetic rod and the second magnetic rod, the gap defined by the first distance between the first end and the third end and the second distance between the second end and the fourth end, wherein the gap increases linearly from the first distance to the second distance.

3. The magnetic position sensor of claim 2, wherein the center axis intercepts the center of the gap between the first end and the third end, and wherein the center axis intercepts the center of the gap between the second end and the fourth end.

4. The magnetic position sensor of claim 1, wherein the first magnetic rod and the second magnetic rod are fixed, and wherein the magnet moves along the center axis.

5. The magnetic position sensor of claim 1, wherein the magnet is fixed, and wherein the first magnetic rod and the second magnetic rod move between the magnet and the one or more magnetic sensors along the center axis.

6. The magnetic position sensor of claim 1, wherein the first magnetic rod and the second magnetic rod are linear.

7. The magnetic position sensor of claim 1, wherein the first magnetic rod and the second magnetic rod are curved.

8. The magnetic position sensor of claim 1, wherein the first magnetic rod and the second magnetic rod are separated by a fixed angle of 0 degrees.

9. The magnetic position sensor of claim 1, wherein the one or more magnetic sensors sense a magnetic flux to determine a location of the magnet.

10. A position detection system comprising:
    a magnetic position sensor including a track, a magnet, and one or more magnetic sensors, the magnetic sensors configured to provide one or more position signals indicative of a position of the magnet along the track based on a magnetic flux;
    one or more temperature sensors configured to provide one or more temperature signals indicative of a temperature of the track; and
    an electronic processor connected to the magnetic position sensor and the temperature sensor, the electronic processor configured to:
        receive the one or more position signals from the magnetic position sensor;
        receive the one or more temperature signals from the one or more temperature sensors; and
        determine a position of the magnet based on the one or more position signals and the one or more temperature signals.

11. The position detection system of claim 10, wherein the track is composed of a first conductive rod and a second conductive rod.

12. The position detection system of claim 11, wherein the first conductive rod extends substantially along a first axis, and wherein the second conductive rod extends substantially along a second axis different from the first axis.

13. The position detection system of claim 12, wherein the second axis is offset from the first axis by a fixed angle of 0 degrees.

14. The position detection system of claim 11, wherein the first conductive rod and the second conductive rod are approximately 550 mm long.

15. The position detection system of claim 10, wherein the one or more magnetic sensors include a first magnetic sensor situated at a first end of the track, and wherein the one or more magnetic sensors include a second magnetic sensor situated at a second end of the track.

16. The position detection system of claim 10, wherein the position signal from the magnetic position sensor is based on a magnetic flux.

17. The position detection system of claim 10, wherein the track is substantially linear.

18. The position detection system of claim 10, wherein the track is substantially arc-shaped.

19. The position detection system of claim 10, wherein the track is composed of one selected from a group consisting of carbon steel, pure iron and Mu-metal.

* * * * *